Feb. 8, 1966 R. L. ANDERSON 3,234,057

SEMICONDUCTOR HETEROJUNCTION DEVICE

Filed June 23, 1961 2 Sheets-Sheet 1

INVENTOR
RICHARD L. ANDERSON

BY
ATTORNEY

SEMICONDUCTOR HETEROJUNCTION DEVICE

Filed June 23, 1961 2 Sheets-Sheet 2

United States Patent Office 3,234,057
Patented Feb. 8, 1966

3,234,057

SEMICONDUCTOR HETEROJUNCTION DEVICE

Richard L. Anderson, Madrid, Spain, assignor to International Business Machines Corporation, New York, N.Y., a corporation of New York Filed June 23, 1961, Ser. No. 128,286
10 Claims. (Cl. 148—33)

Figure 1:
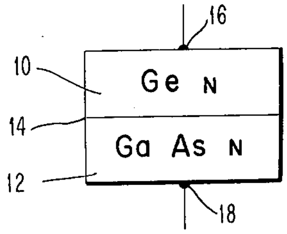

The present invention relates to a novel semiconductor junction device and more particularly relates to such a device wherein different semiconductor materials of the same conductivity type are joined together to form a rectifying electrical contact.

The semiconductor art, since the initial development of the transistor, has become a highly developed and complex area. Vast quantities of money and effort are being continually expended in this highly competitive field to develop new devices and methods which will produce some new effect or result in operational or fabrication improvements.

It is known that certain advantageous results may be obtained by joining in a single semiconductor device two different semiconductor materials of opposite conductivity types to form a p-n junction. Such a device gives a wider potential range of operating characteristics than are possible when using a single type of semiconductor and different types and concentrations of conductivity type determining impurities. However, it has always been thought that both "p" and "n" conductivity type determining impurities or dopants on respective sides of the junction were necessary to the successful formation of a rectifying junction.

Metal-semiconductor junctions have also been proposed but due to the abrupt change in the structure and periodicity of the lattice of the two materials resulting in disorder near the interface, such devices have not proved practical nor are they well understood.

It has now been found that a novel and useful rectifying junction can be formed by joining two different semiconductor materials to form a heterojunction wherein both materials contain the same conductivity type determining impurities.

A specific example of such a heterojunction is that of germanium and gallium arsenide made by a process of epitaxial vapor deposition which process will be more fully described later.

It is accordingly a primary object of the present invention to provide a novel semiconductor device.

It is a further object to provide such a device which comprises two different semiconductor materials forming an electrical junction having rectifying properties.

It is a still further object to provide such a heterojunction device containing the same conductivity type dopants on both sides of the junction.

The foregoing and other objects, features and advantages of the invention will be apparent from the following more particular description of a preferred embodiment of the invention, as illustrated in the accompanying drawings.

In the drawings:

FIG. 1 is a cross-sectional view of a preferred embodiment of a semiconductor device in accordance with the present invention.

Figure 2A:
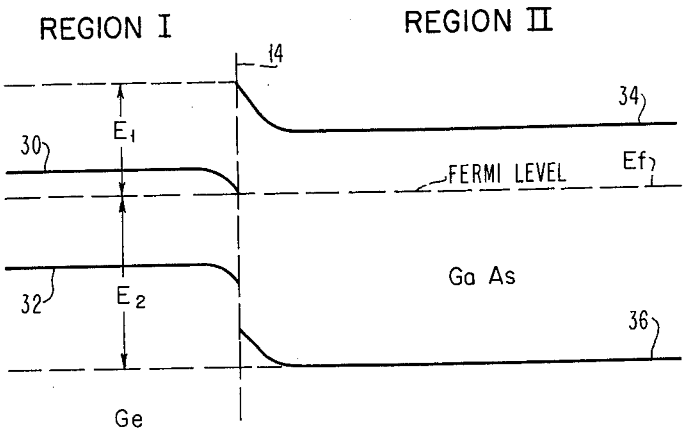
Figure 2B:
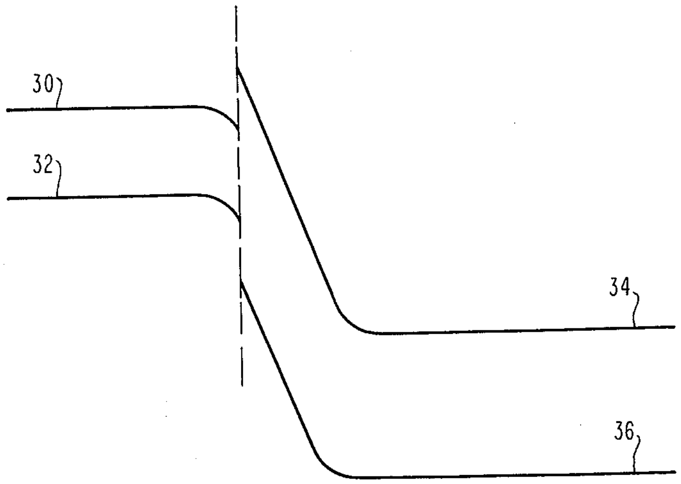
Figure 2C:
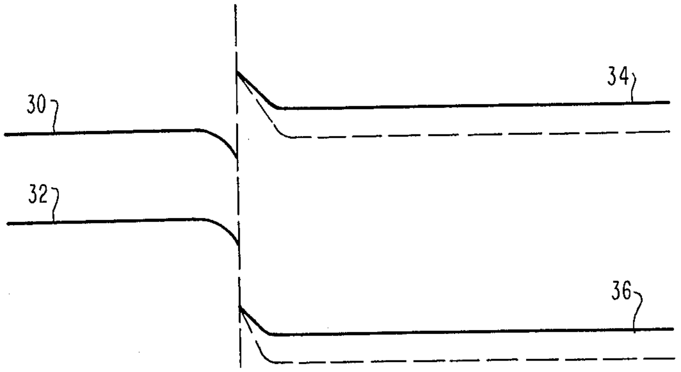

FIGS. 2(*a*), 2(*b*) and 2(*c*) are energy band profile diagrams in the vicinity of the junction of the device of FIG. 1 under different conditions of bias.

Figure 4:
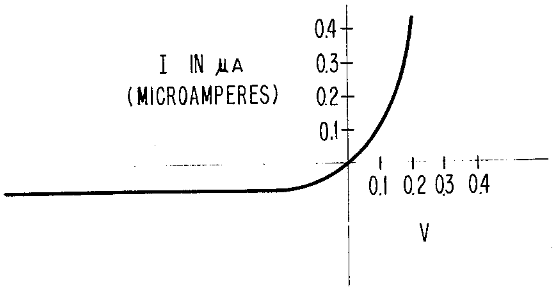
Figure 3:
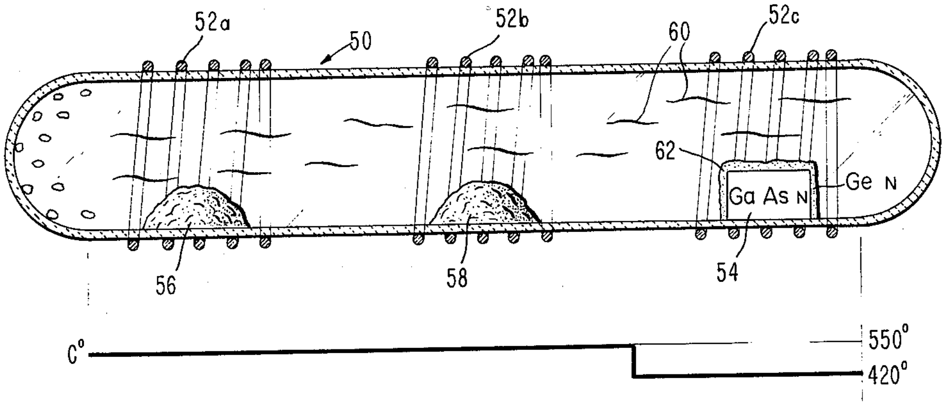

FIG. 3 is a schematic representation of apparatus suitable for preparing such a device and a temperature graph dimensionally correlated therewith, and FIG. 4 is a typical I–V characteristic curve for an n-n semiconductor heterojunction as illustrated in FIG. 1.

The objects of the present invention are accomplished in general by a semiconductor device which comprises two different semiconductor materials of the same conductivity type joined together to form a rectifying junction.

The term rectifying junction as used herein is not necessarily intended to be limited to the normal diode characteristic but also to junctions which exhibit different I–V characteristics under conditions of forward and reverse bias respectively.

It has been found to be very difficult in practice to provide a transition region between one semiconductor material and another semiconductor material while maintaining the monocrystalline structure. In the past, in devices of this type the different semiconductor materials have been of a mono-atomic or elemental type involving the more popular semiconductors germanium and silicon and the intermetallic type wherein two elements of the periodic table on either side of group 4 combine in a single monocrystalline structure. The inter-atomic spacings of the intermetallic semiconductors are frequently quite incompatible with those of the mono-atomic semiconductors and transition regions in single devices have been difficult to fabricate without many carrier traps for this reason. Also, the two semiconductor regions on opposite sides of the transition region have been oppositely doped to provide the usual p-n junction effect.

However, according to the present invention not only has a homogenous crystalline junction been formed between an elemental semiconductor material and an intermetallic semiconductor material but also a very pronounced rectifying effect has been attained when the dopants on either side of the junction are of the same conductivity type, i.e., n-n or p-p. It is also within the scope of this invention to provide other heterojunction semiconductor devices wherein the two semiconductor materials chosen are of sufficiently similar crystalline structure to form a substantially continuous crystalline or monocrystalline barrier region and to produce a rectifying effect when both sides of the junction are similarly doped.

It has further been found that the inter-atomic spacing of Ge and GaAs in single crystals are so closely matched that the transition region from the GaAs to the Ge is virtually free of interface defects and that in fact an abrupt junction can be made while at the same time obtaining a substantially continuous crystalline structure between the two materials.

Referring to FIG. 1 which is a schematic cross-sectional diagram of a preferred embodiment of the device there is shown a region 10 of monocrystalline "n" type germanium (Ge) and a region 12 of monocrystalline "n" type gallium arsenide (GaAs). These two regions form junction 14 therebetween and are provided with ohmic contacts 16 and 18 to facilitate connection to an external circuit. Devices constructed in accordance with this model have exhibited pronounced differences when biased in the forward or reverse direction and when the wide gap material (in this example the GaAs) is very lightly doped a very high forward to reverse current ratio is obtained.

The theory of operation will now be described with respect to the energy band profile diagram of FIGS. 2(*a*), 2(*b*) and 2(*c*). While this explanation is believed to have a sound logical and scientific basis, it is to be understood that it is not intended to limit the invention hereby.

In FIG. 2(*a*) which shows the device at equilibrium in region I (Ge) line 30 represents the lower edge of the conduction band and line 32 the upper edge of the valence band. And similarly in region II (GaAs) line 34 represents the lower edge of the conduction band and line 36 the upper edge of the valence band. The discontinuous vertical line 14 represents the junction or interface. It will be noted that the conduction and valance band lines are discontinuous at the interface and that the energy band gap or difference in vertical distance between the conduction and valance band lines in the two materials is different. The discontinuous horizontal line $E_f$ is the Fermi level in the two materials. The numerals used in FIGS. 2(*a*), 2(*b*) and 2(*c*) are the same for similar portions of the curves.

Since the work function of the narrow gap semiconductor is the greater, the energy bands will be bent oppositely to an n-p case. However, there are a negligible number of states available in the valence band and so the excess electrons in the material of greater work function will occupy states in the conduction band. Since there are a large number of states available in the conduction band, the transition region extends only a small distance into the narrow band material, unless the donor concentration of the narrow gap material is very much less than that in the wide gap material.

Referring still to FIG. 2(*a*), there are equal and opposite currents in each direction due to thermal velocity of electrons and due to thermal velocity of holes but since the energy $E_2$ (FIG. 2(*a*)) is less than energy $E_1$, the current will be almost entirely due to electrons.

Now only those electrons with thermal energy great enough to surmount the barrier can contribute to current and at equilibrium the currents are equal and opposite and so there is no net current.

FIG. 2(*b*) shows an energy band diagram of an n-n heterojunction with reverse bias applied or the GaAs is made positive with respect to the Ge. Now the barrier to electrons going from the Ge to the GaAs is affected very little by the application of voltage and so the current due to these electrons is reasonably unchanged. However, the applied voltage increased the barrier for electrons traveling in the other direction and so there is effectively no "opposite"current. The current then consists essentially of electrons going from Ge to GaAs and is reasonably independent of voltage.

FIG. 2(*c*) shows the case for forward bias. Again applied voltage has little effect on the barrier from left to right but decreases the barrier from right to left. Since the electrons are distributed approximately exponentially with voltage, the current is expected to increase exponentially with voltage as is observed.

The above description applies specifically to Ge-GaAs junctions. The following is a more general discussion.

To have a rectifying junction it is necessary that the work functions of the two materials be different. To have a practical rectifier, the difference in work functions must be greater than about 4KT where KT is thermal energy. Now in an "ordinary" junction or "homojunction" this can only be accomplished by making one side n type and the other side p type since the conduction and valence band edges are continuous.

In a heterojunction the band edges are discontinuous and so a difference in work function exists even with equal dopings of the same kind (i.e. holes or electrons) on each side. The only criteria for a practical n-n junction is that the conduction band edges be discontinuous by about greater than 4KT, and for a p-p junction that the valence band edges (32, 36 (FIG. 2(*a*)) be discontinuous by this value.

A preferred process for making such a heterojunction device involves the use of a suitably doped gallium arsenide (GaAs) substrate and epitaxially depositing germanium (Ge) on the GaAs by decomposing a gaseous compound of the Ge. In order to fabricate such a heterojunction device, very close and careful control is necessary to obtain a transition region between the two semiconductor materials having the proper crystalline structure.

The technique of epitaxial deposition involves the decomposition of a gaseous compound of a transport element usually a halide, and a semiconductor material so that free semiconductor material is deposited on a substrate. Where the substrate is a single crystal, the same crystalline orientation and periodicity of the substrate is maintained. The technique is practiced both in sealed systems and in systems involving a steady flow of gas.

For a more advanced description of epitaxial deposition per se reference is made to an article by J. C. Marinace entitled "Epitaxial Vapor Growth of Ge Single Crystals in a Closed Cycle Process" in the IBM Journal of Research and Development, vol. 4, No. 3, July 1960.

Referring to FIG. 3, an illustration of an apparatus and the reaction involved in the production of a device in accordance with the invention is shown. In this figure a multiple temperature stage furnace is shown schematically. The furnace is made up of a sealed container 50 which for example may be of quartz or other refractory material, around which are wound a plurality of independent heating coils 52*a*, 52*b* and 52*c*. The heating coils are shown schematically as resistance windings.

It will be apparent to one skilled in the art and from subsequent discussion that any controllable source of heat which serves to provide an overall high temperature in the furnace and also specific temperature differences within individual discrete regions in the furnace will serve the purpose.

The sealed container 10 is provided to serve as an environment control and thermal insulator for the deposition reation. At a particular site within the furnace, a substrate of monocrystalline gallium arsenide (GaAs) 54 is positioned. The monocrystalline gallium arsenide substrate 54 may be of any conductivity type and in any configuration such as a single block as illustrated or as a block with appropriate masking to prevent deposition in places that are not wanted so that matrices of devices may be simultaneously formed using the block as a common substrate. A quantity of germanium semiconductor material labelled element 56 is provided as a source and while it is not essential that the germanium 56 be in any specific form, it is shown here as a pile of finely divided material. The germanium 56 is positioned at another temperature controlled site within the sealed reaction tube 50. The conductivity type of the deposited germanium may be controlled by including the impurities in the germanium 56 or adding them during deposition from a separate controllable location. A quantity of a transport element labelled element 58 is also positioned in the reaction tube 50.

In operation, a high temperature, between about 550° and 700° C. is established in the sealed tube 50 in the vicinity of the region of semiconductor material 56. This is accomplished by applying power to coils 52*a*, 52*b* and 52*c* such that the gallium arsenide substrate 54, the source germanium 56 and the transport element 58 are brought to a temperature sufficient to vaporize the transport element 7 and cause it to combine with the source germanium 56 forming a gas labelled element 60. The transport element 58 is preferably a halogen such as iodine. In addition to the vaporization temperature, by appropriate adjusting of the temperature of the substrate, as for example, by making it the lowest temperature point in the system, for example at about 420° C., it is possible to cause the halide compound of the source germanium 56 in the gas 60 to decompose thereby freeing the halogen 58 to further combine with the source material 56 and to epitaxially deposit free germanium as a monocrystalline germanium extension of the substrate 54. The deposit has been labelled element 62. Since the substrate 54 is a single crystal, and the germanium deposits epitaxially the same crystalline orientation and periodicity as the gallium arsenide crystal of the substrate is maintained.

In a specific example of the above process, to remove any oxides on the GaAs surface, the gallium arsenide was etched for a period of about 10 minutes by the iodine vapor and hydrogen before the deposition of germanium on the GaAs was initiated. Phosphorous doped Ge was deposited on the n type GaAs substrate. In this example the deposited Ge was much more heavily doped (with phosphorous) than was the GaAs. The net donor concentration in the Ge was determined by resistivity measurements and was found to be about $10^{19}$/cc. Capacity measurements were made to determine the net donor concentration in the GaAs. At the edge of the transition region at equilibrium, the net donor concentration was measured and found to be about $4 \times 10^{16}$ atoms/cc. of GaAs.

An I–V characteristic curve for the forwardly biased n-n heterojunction device of this example is shown in FIG. 4. It will be noted that the relative dependence of current on voltage follows the description of FIGS. 2(*a*), 2(*b*) and 2(*c*).

Among the many advantages to be achieved from n-n or p-p heterojunctions in accordance with the present invention is the elimination of diffusion capacitance since there is no minority carrier diffusion. In p-n junctions operated with forward bias diffusion capacitance can be a limiting factor in maximum frequency response. Another advantage is the reduction of storage effects, i.e., minority carriers since conduction is entirely by majority carriers and there are no minority carriers injected. These advantages make possible very rapid cut-off times thus suggesting their use in switching circuits where speed is essential.

It is to be further understood that having once been taught the principles of the present invention a person skilled in the art would be able, through experimentation, to choose other compatible semiconductor materials and operable doping levels therefor. For example rectifying heterojunction structures of the following types may be made: Aluminum phosphide (AlP)—gallium phosphide (GaP); aluminum phosphide (AlP)—silicon (Si); aluminum arsenide (AlAs)—gallium arsenide (GaAs); aluminum arsenide (AlAs)—germanium (Ge); germanium (Ge)—silicon (Si); aluminum antimonide (AlSb)—gallium antimonide (GaSb); indium antimonide (InSb)—tin (Sn) and others. These materials may be provided with either "n" or "p" conductivity type determining impurities.

Further and more sophisticated semiconductor structures, involving different conductivity types and gradients of concentrations of conductivity type determining impurities in individual semiconductor zones may also be readily fabricated, employing an extension of the teachings of the invention.

While the invention has been particularly shown and described with reference to a preferred embodiment thereof, it will be understood by those skilled in the art that various changes in form and details other than those alluded to above may be made therein without departing from the spirit and the scope of the invention.

What is claimed is:

1. A semiconductor device comprising a monocrystalline region of a first semiconductor material of one conductivity type and a second region of a second monocrystalline semiconductor material of the same conductivity type joined in a substantially continuous crystalline interface to form a rectifying electrical junction and exhibiting a substantially continuous crystalline interface at said junction, and wherein said device is characterized by the fact that the conduction bands are discontinuous at the junction by an amount at least equal to 4KT where KT is thermal energy.

2. A semiconductor device as set forth in claim 1 wherein the first material is germanium and the second material is gallium arsenide.

3. A semiconductor device comprising a first region of monocrystalline germanium, a second region of monocrystalline silicon epitaxially deposited thereon and forming a rectifying junction therebetween wherein both materials contain conductivity type determining impurities of the same type and wherein one material has a higher work function than the other relative to the conductivity type determining impurity present in the material.

4. A semiconductor device comprising a first region of monocrystalline aluminum phosphide, a second region of monocrystalline gallium phosphide epitaxially deposited thereon and forming a rectifying junction therebetween wherein both materials contain conductivity type determining impurities of the same type and wherein one material has a higher work function than the other relative to the conductivity type determining impurity present in the material.

5. A semiconductor device comprising a first region of monocrystalline aluminum phosphide, a second region of monocrystalline silicon epitaxially deposited thereon and forming a rectifying junction therebetween wherein both materials contain conductivity type determining impurities of the same type and wherein one material has a higher work function than the other relative to the conductivity type determining impurity present in the material.

6. A semiconductor device comprising a first region of monocrystalline gallium phosphide, a second region of monocrystalline silicon epitaxially deposited thereon and forming a rectifying junction therebetween wherein both materials contain conductivity type determiing impurities of the same type and wherein one material has a higher work function than the other relative to the conductivity type determining impurity present in the material.

7. A semiconductor device comprising a first region of monocrystalline aluminum arsenic, a second region of monocrystalline gallium arsenide epitaxially deposited thereon and forming a rectifying junction therebetween wherein both materials contain conductivity type determining impurities of the same type and wherein one material has a higher work function than the other relative to the conductivity type determining impurity present in the material.

8. A semiconductor device comprising a first region of monocrystalline aluminum arsenide, a second region of monocrystalline germanium epitaxially deposited thereon and forming a rectifying junction therebetween wherein both materials contain conductivity type determining impurities of the same type and wherein one material has a higher work function than the other relative to the conductivity type determining impurity present in the material.

9. A semiconductor device comprising a first region of monocrystalline aluminum antimonide, a second region of monocrystalline gallium antimonide epitaxially deposited thereon and forming a rectifying junction therebetween wherein both materials contain conductivity type determining impurities of the same type and wherein one material has a higher work function than the other relative to the conductivity type determining impurity present in the material.

10. A semiconductor device comprising a first region of monocrystalline indium antimonide, a second region of monocrystalline tin epitaxially deposited thereon and forming a rectifying junction therebetween wherein both materials contain conductivity type determining impurities of the same type and wherein one material has a higher work function than the other relative to the conductivity type determining impurity present in the material.

References Cited by the Examiner

UNITED STATES PATENTS

| | | | |
|---|---|---|---|
| 2,798,989 | 7/1957 | Welker | 148—1.5 |
| 2,929,859 | 3/1960 | Loferski | 148—33 |
| 3,079,512 | 2/1963 | Rutz | 148—33 |
| 3,082,283 | 3/1963 | Anderson | 136—89 |
| 3,104,991 | 9/1963 | MacDonald | 148—1.5 |

FOREIGN PATENTS

| | | |
|---|---|---|
| 1,184,921 | 2/1959 | France. |
| 1,193,194 | 4/1959 | France. |
| 742,237 | 12/1955 | Great Britain. |
| 843,407 | 8/1960 | Great Britain. |

OTHER REFERENCES

Ge-GaAs Contacts, Dissertation for Ph.D., Syracuse University, January 1960, pp. 80–82.

DAVID L. RECK, *Primary Examiner.*

MARCUS U. LYONS, *Examiner.*